United States Patent
Zaccaria

(10) Patent No.: US 6,611,774 B1
(45) Date of Patent: Aug. 26, 2003

(54) METHOD AND APPARATUS FOR THE CONTINUOUS PERFORMANCE MONITORING OF A LEAD ACID BATTERY SYSTEM

(75) Inventor: Robert Zaccaria, St-Lin (CA)

(73) Assignee: Enersafe, Inc., St. Petersburg, FL (US)

( * ) Notice: Subject to any disclaimer, the term of this patent is extended or adjusted under 35 U.S.C. 154(b) by 0 days.

(21) Appl. No.: 09/159,497

(22) Filed: Sep. 23, 1998

(30) Foreign Application Priority Data

Aug. 19, 1998 (CA) .............................. 2242497

(51) Int. Cl.[7] .............................................. H01M 10/48
(52) U.S. Cl. ............................. 702/63; 702/64; 702/65; 702/188; 320/116
(58) Field of Search ........................ 702/57–60, 62–64, 702/65, 117, 118, 124, 126, 182–185, 187, 188, 198, FOR 103, FOR 104, FOR 105, FOR 106, FOR 111, FOR 134, FOR 135, FOR 170, FOR 171; 324/430, 426, 427, 429, 434, 435; 340/636; 320/148, 149, DIG. 13, DIG. 18, DIG. 22, 116; 307/64–66, 46, 48–50; 700/291, 293, 295

(56) References Cited

U.S. PATENT DOCUMENTS

| | | | |
|---|---|---|---|
| 4,217,645 A | 8/1980 | Barry et al. | 364/483 |
| 4,678,998 A | 7/1987 | Muramatsu | 324/427 |
| 4,697,134 A | 9/1987 | Burkum et al. | 320/134 |
| 4,707,795 A | 11/1987 | Alber et al. | 364/550 |
| 4,916,438 A | 4/1990 | Collins et al. | 340/636 |
| 4,929,931 A | 5/1990 | McCuen | 340/636 |
| 4,947,123 A | 8/1990 | Minezawa | 324/427 |
| 5,039,624 A | 8/1991 | Kadota | 437/31 |
| 5,047,722 A | 9/1991 | Wurst et al. | 324/430 |
| 5,130,659 A | 7/1992 | Sloan | 324/435 |
| 5,137,020 A | 8/1992 | Wayne et al. | 128/419 PS |
| 5,159,272 A | 10/1992 | Rao et al. | 324/429 |
| 5,160,880 A | 11/1992 | Palanisamy | 320/32 |
| 5,206,578 A | 4/1993 | Nor | 320/14 |
| 5,239,286 A | 8/1993 | Komatsuda | 340/636 |
| 5,250,904 A | 10/1993 | Salander et al. | 324/430 |
| 5,281,920 A * | 1/1994 | Wurst | 324/430 |
| 5,321,626 A * | 6/1994 | Palladino | 340/636 |
| 5,321,627 A | 6/1994 | Reher | 364/483 |
| 5,325,041 A | 6/1994 | Briggs | 320/44 |
| 5,546,003 A | 8/1996 | Noworolski et al. | 324/434 |
| 5,574,355 A | 11/1996 | McShane et al. | 320/39 |
| 5,619,417 A * | 4/1997 | Kendall | 320/DIG. 13 |
| 5,631,540 A | 5/1997 | Nguyen | 320/30 |
| 5,652,498 A * | 7/1997 | Edye et al. | 702/63 |
| 5,705,929 A * | 1/1998 | Caravello et al. | 324/430 |
| 5,945,829 A * | 8/1999 | Bertness | 324/434 |
| 6,031,354 A * | 2/2000 | Wiley et al. | 320/116 |

OTHER PUBLICATIONS

"New BCM1100—Battery Cycle Monitor", C & D Power Systems, Advertising Brochure 4 pages, 1990, (No month).
"Battery Cycle Monitor—Users Manual", C & D Power Systems, Version 1.55 (Jul. 31, 1991), pp. 1–6.

(List continued on next page.)

Primary Examiner—Hal Wachsman
(74) Attorney, Agent, or Firm—Pepper Hamilton LLP; James M. Singer

(57) ABSTRACT

The present invention concerns a battery monitoring system for monitoring a plurality of batteries serially connected to form a string. The battery monitoring system includes a number of probes connected to at least a portion of the string, a daisy chain bus having a select channel for serially interconnecting the probes, the bus having other, parallel channels for data communication and power, and a system server. The probes each have a sensing module and a communication module. The sensing module senses characteristics of at least a portion of the string, such as voltage or current. The communication module receives the sensed characteristics and converts them into digital form for broadcast to the system server over the bus. The communication module of the probes have a memory for storing an address assigned to the corresponding probe upon reception of an initialization signal sent by the system server via the bus.

17 Claims, 7 Drawing Sheets

OTHER PUBLICATIONS

"CEL CHK Battery Monitor Model X–180", Scan–Pacific Inc., Aug. 28, 1989, Advertising Brochure, 6 pages.

"DC Tracker Battery Monitor", International Power Machines, 1994, Advertising Brochure, 2 pgs. (No month).

"Automated Battery Management", Autocap Solutions Inc., undated, Advertising Brochure, 2 pgs. (No date).

"Considerations for a Reliable Telecommunications Power System at Remote Facilities Utilizing Valve Regulated Lead–Acid Battery Management System Technologies", F.J. Suiter, T.M. Cortes, 1994, Sixteenth International Telecommunications conference, Oct. 30–Nov. 3, 1994, Vancouver, Canada, pp. 464–466,468.

"A Deterioration Estimating System for 200–Ah Sealed Lead–Acid Batteries", Y. Konya, T. Takeda, K. Takano, M. Kohno, K. Yotsumoto, T. Ogata, 1994, Sixteenth International Telecommunications conference,Oct. 30–Nov. 3, 1994, Vancouver, Canada, pp. 256–262).

"SBM–320 Battery Monitor System", Albér Engineering Inc., undated, Advertising Brochure. (No date).

"SBM–320 Battery Monitor Systems—Operations Manual", Version SB.2, 1992, pp. 1–3.13, (No month).

"BTech Battery Validation System", BTech Inc., Advertising Brochure, 1994, 4 pages. (No month).

"BTech Battery Validation System", Model BVS–CR1, Advertising Brochure, 1994, 1 page. (No month).

"Monitor Alarm and Control System", Bulletin 11.100, PECO II Inc., Jun. 1993, 4 pages.

"Monitor Alarm and Control System", Bulletin11.102, PECO II Inc., Jan. 1996, (2 pages).

"Monitor Alarm and Control System", Bulletin11.101, PECO II Inc., Jan. 1996, (2 pages).

"Monitor Alarm and Control System", Bulletin11.900, PECO II Inc., Jan. 1996, 2 pages.

"Monitor Alarm and Control System", Bulletin11.200, PECO II Inc., Jun. 1993, 3 pages.

\* cited by examiner

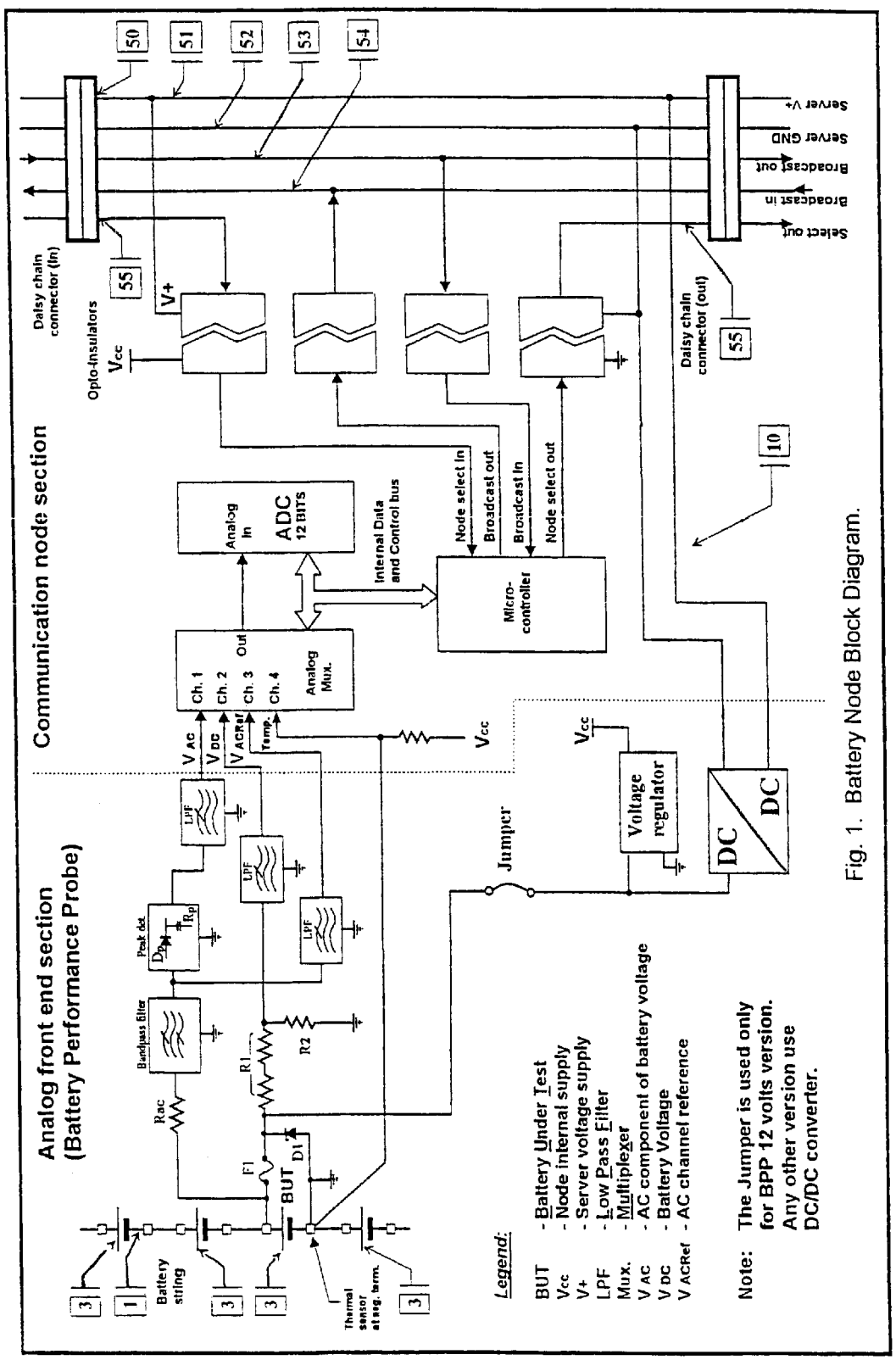
Fig. 1. Battery Node Block Diagram.

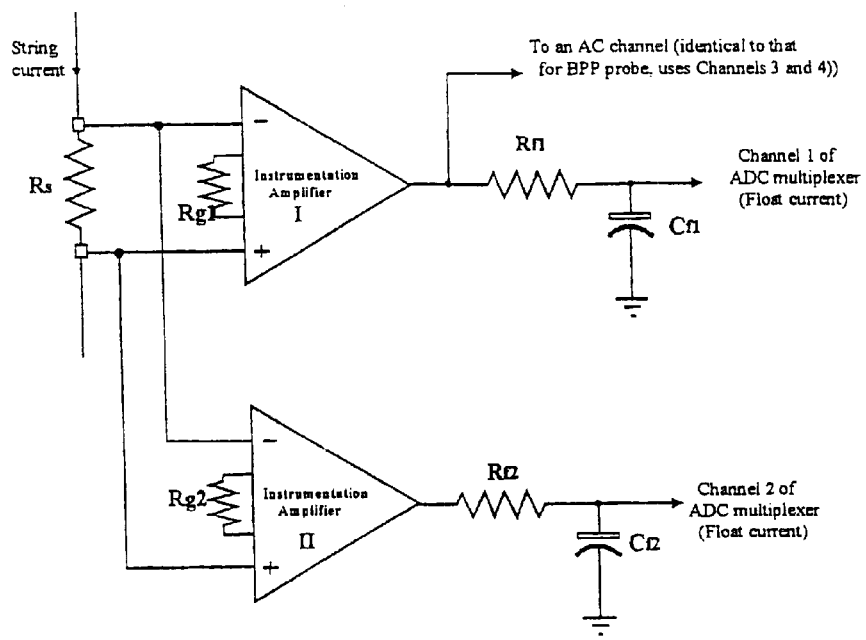
Fig. 2. Current Probe Analog Front End
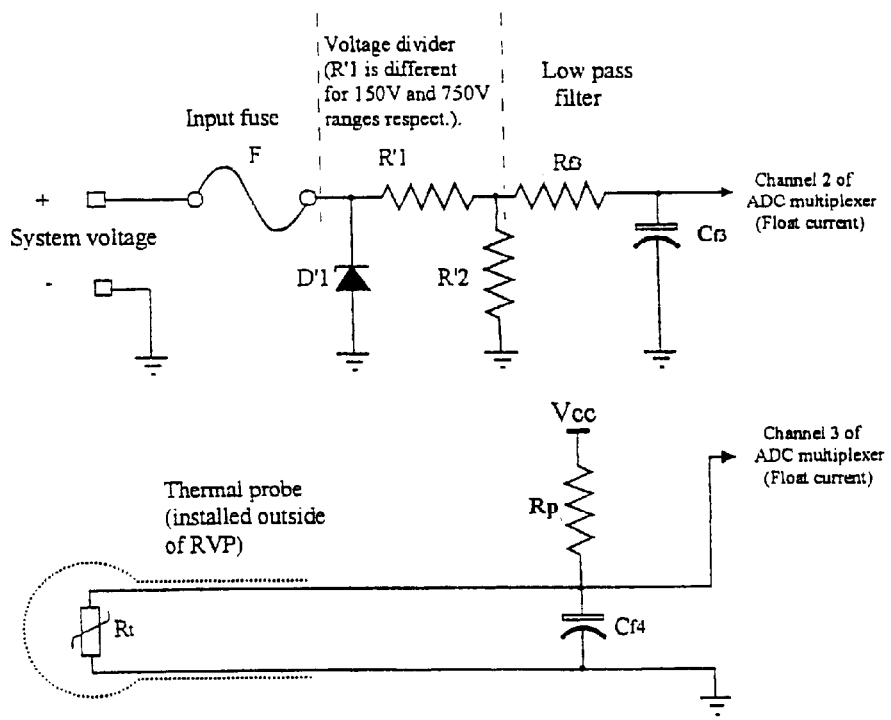
Fig. 3. Rectifier Voltage Probe Analog Front End

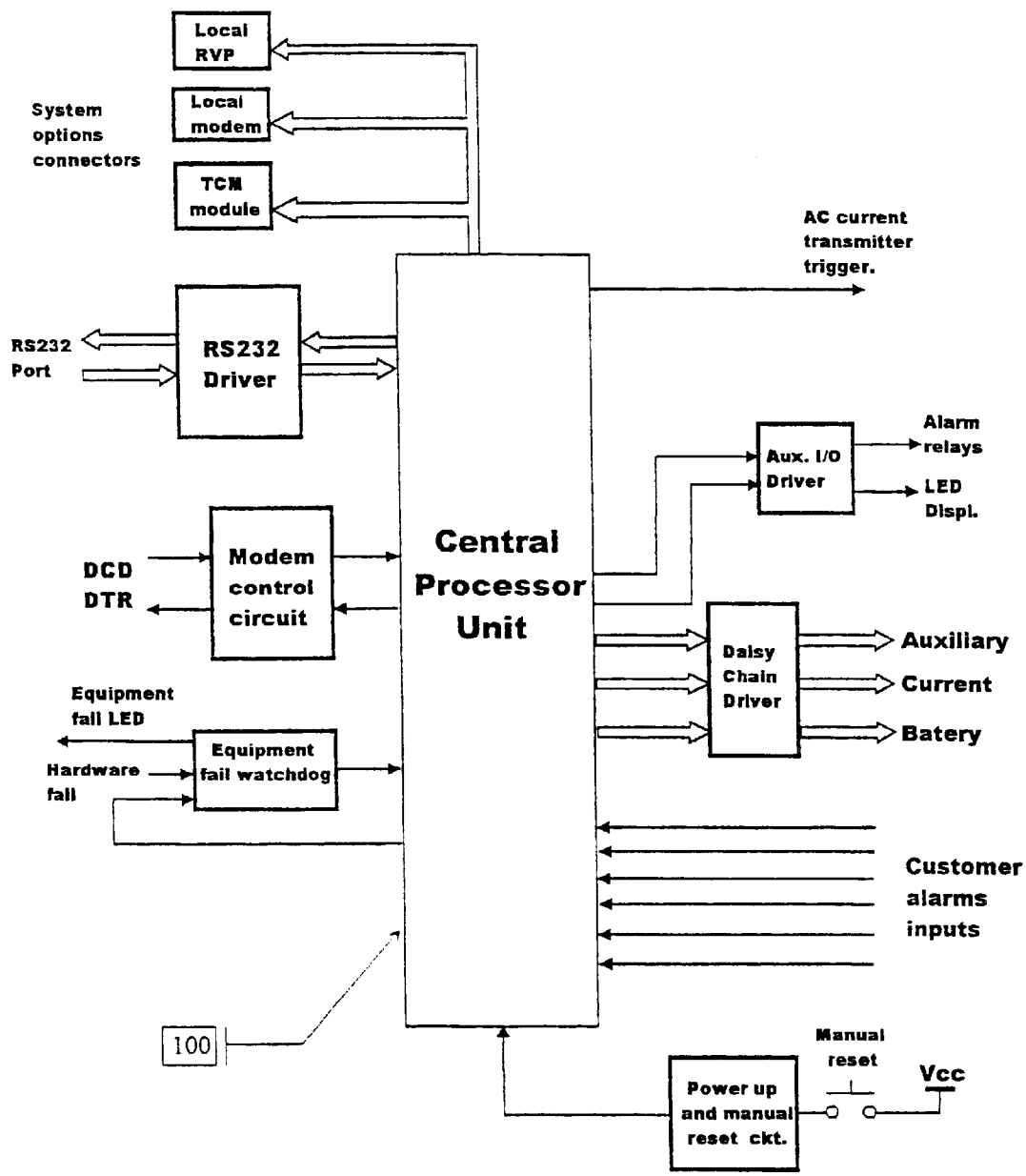
Fig. 4. System server block diagram

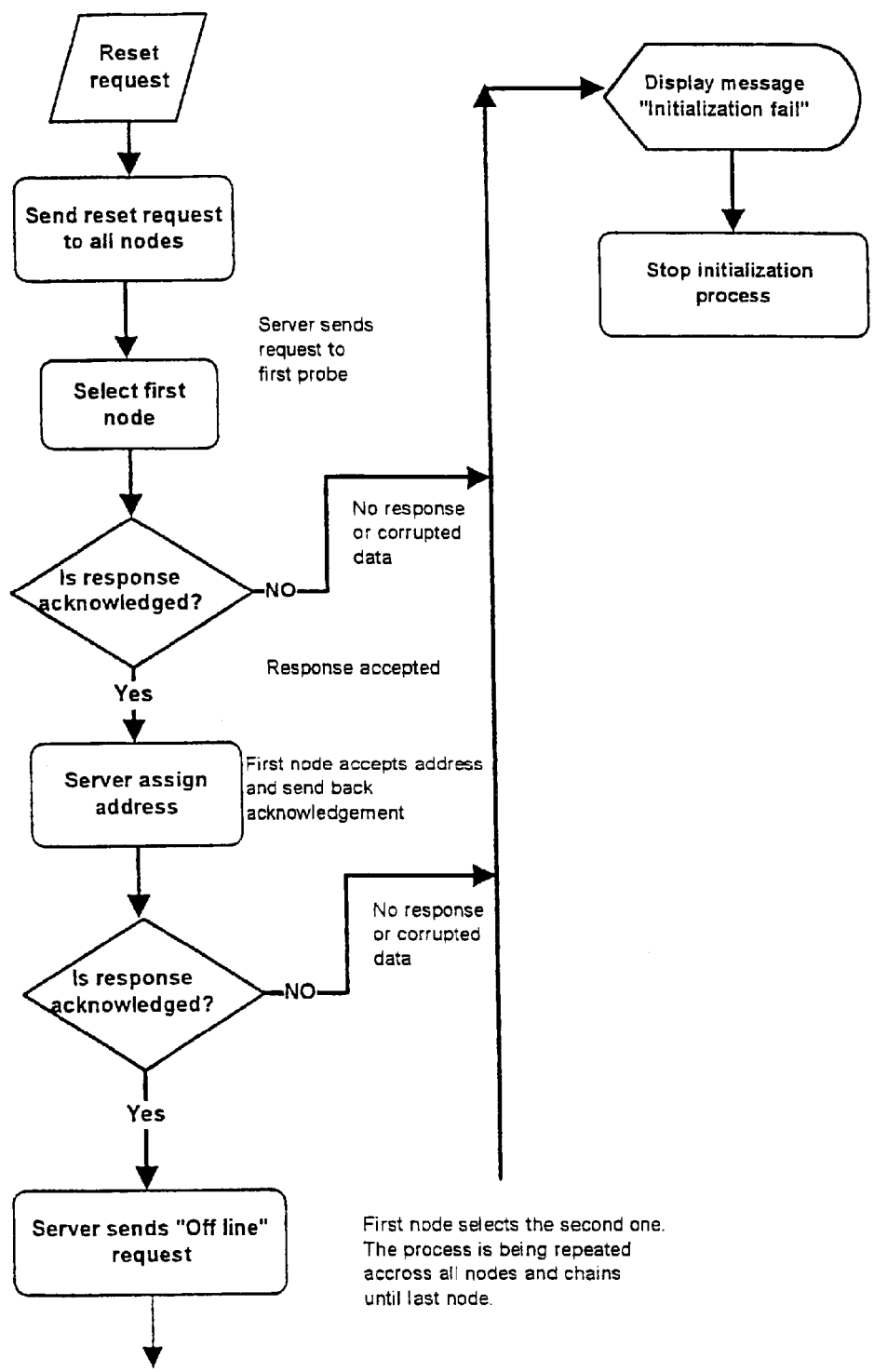
Fig. 5. Daisy chain reset and addressing process

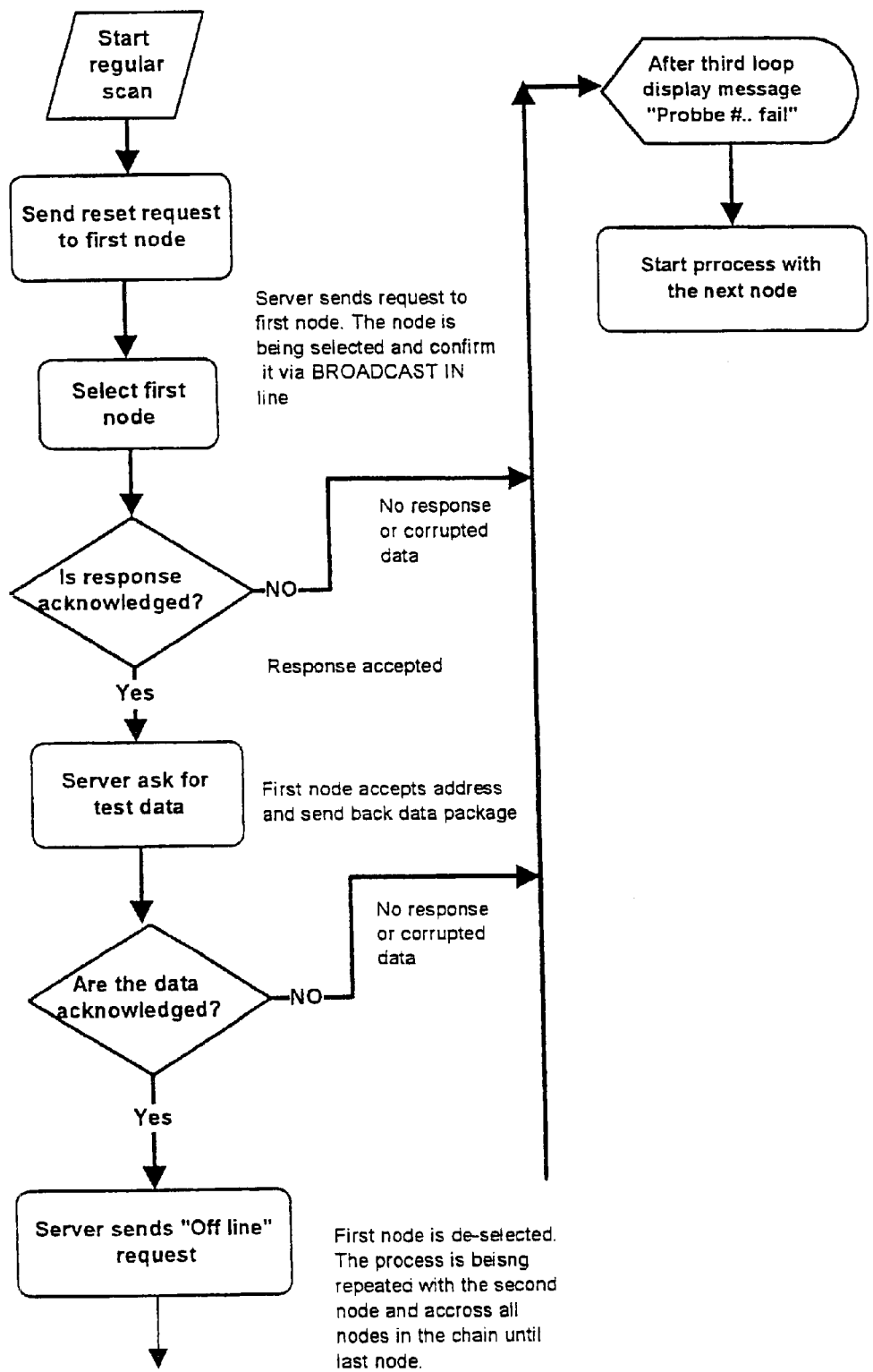
Fig. 6. Daisy chain regular scan

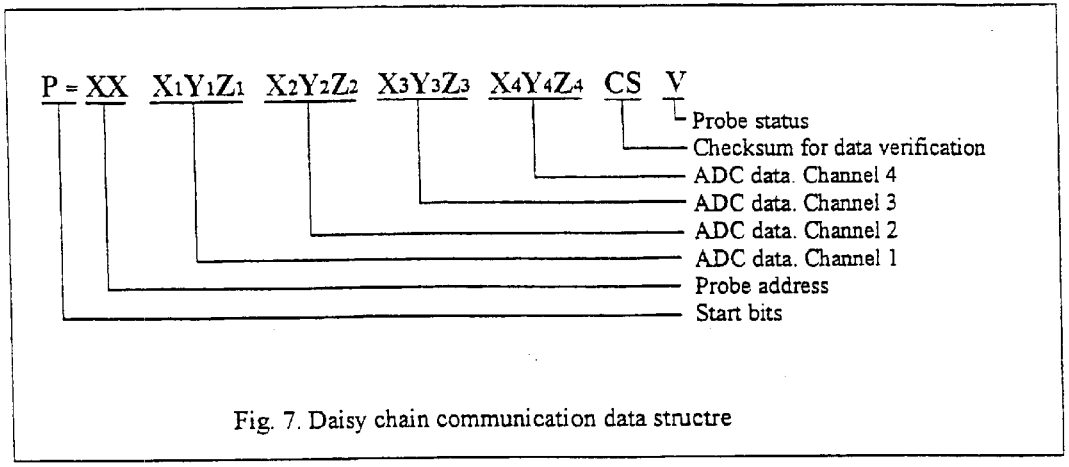
Fig. 7. Daisy chain communication data structre
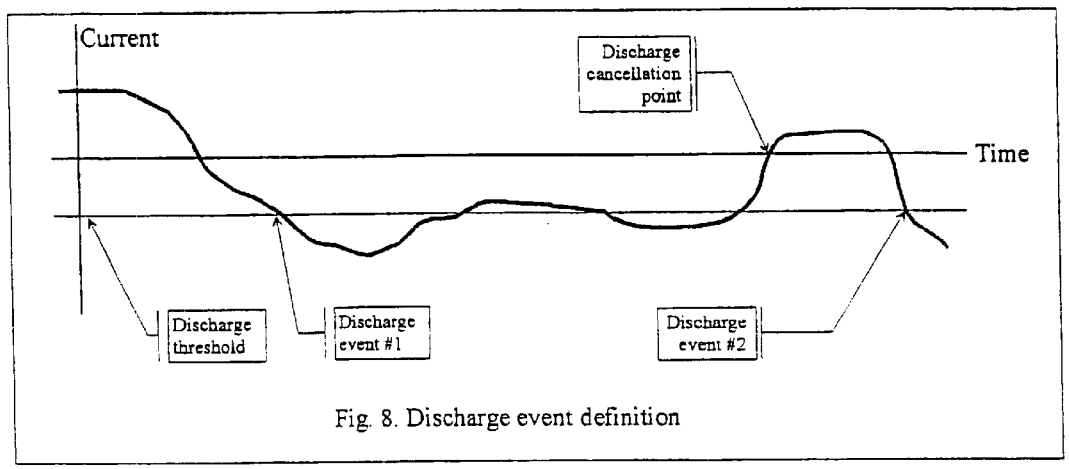
Fig. 8. Discharge event definition
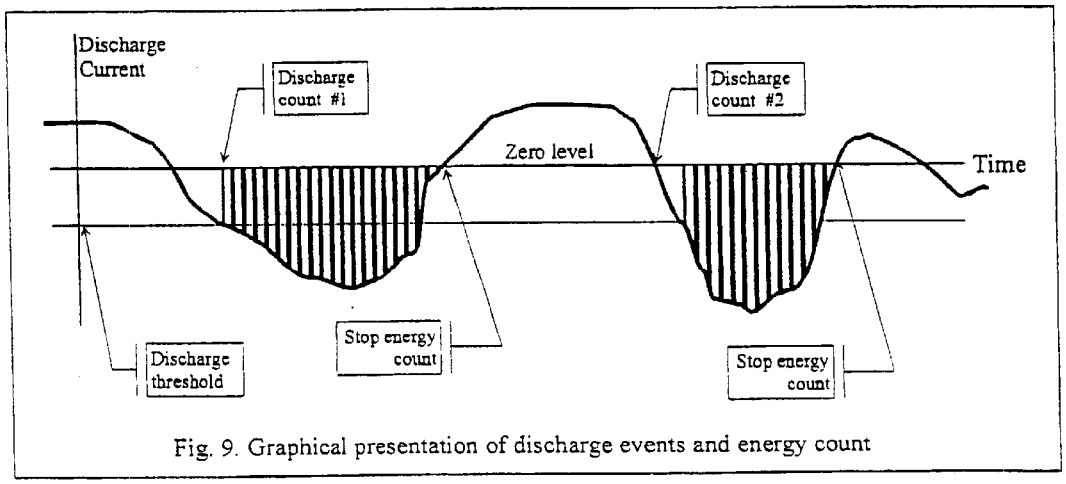
Fig. 9. Graphical presentation of discharge events and energy count

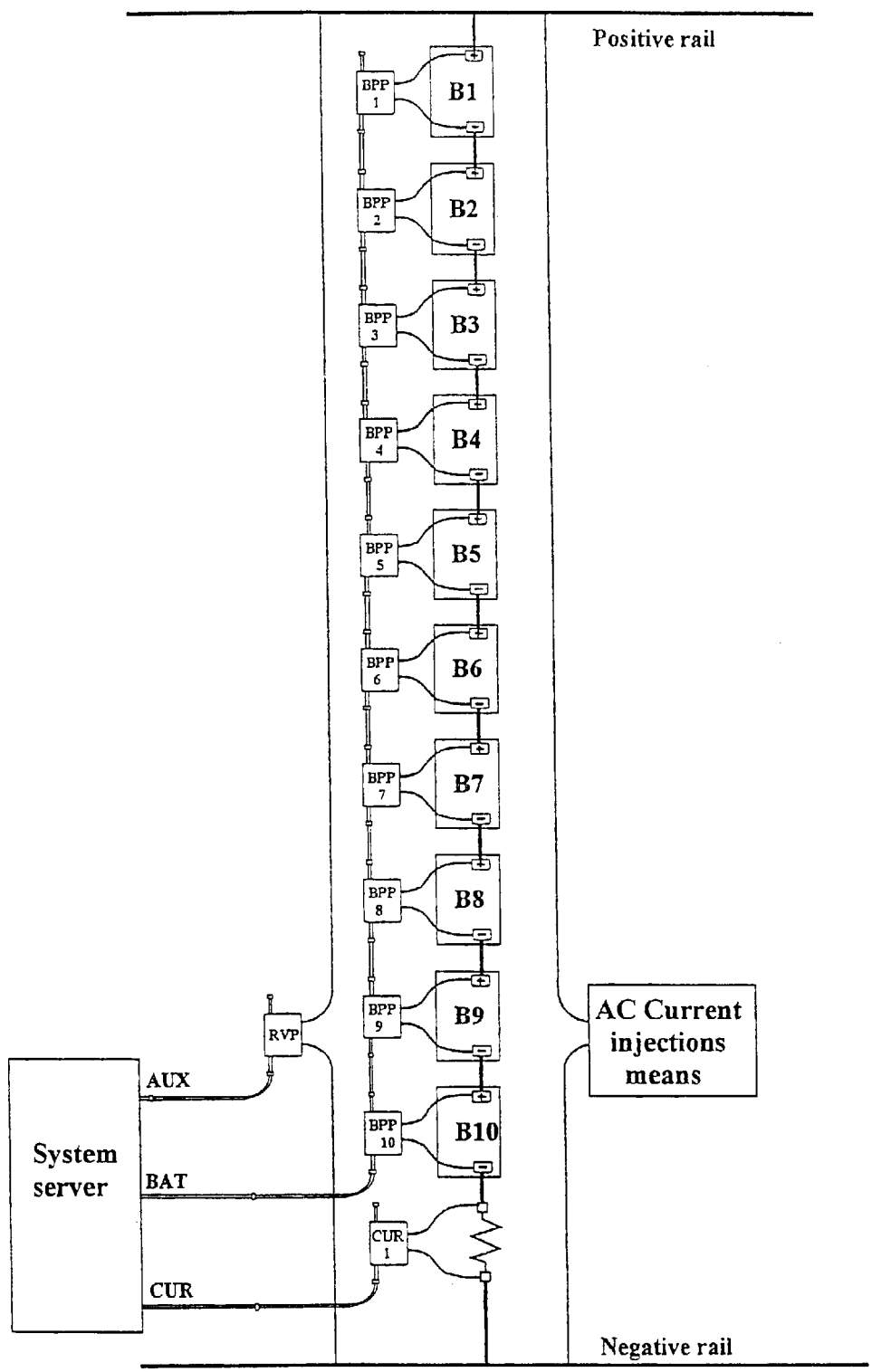
Fig. 10. Monitoring system block diagram

METHOD AND APPARATUS FOR THE CONTINUOUS PERFORMANCE MONITORING OF A LEAD ACID BATTERY SYSTEM

This application claims priority from Canadian Patent Application No. 2,242,497.

FIELD OF THE INVENTION

The present invention relates to a method and apparatus for the continuous performance monitoring of a lead acid battery system, and more particularly to such a method and apparatus which is easier to install and implement and provides added flexibility.

DESCRIPTION OF THE PRIOR ART

Lead acid batteries are a commonly used source of electrical energy in the case when a main source, typically an AC supply line, fails. Typically, a bank of batteries will be interconnected in a system configuration to provide the desired voltage and power for short term emergency situations, until the AC supply line is re-established or until a generator can provide the necessary power requirements. Such systems are often used as back-ups for hospital equipment, telecommunications equipment, computer equipment, etc.

However, battery systems represent what has been termed a bullet approach, i.e. their performance is only truly evaluated when they are in use. This is a considerable inconvenience, since the reliability of the entire system is dependent on each of the batteries. Should the battery system fail, this can lead to considerable monetary loss, and considerable loss of service with critical consequences, particularly in the case of hospital equipment and telecommunications systems.

There are a number of symptoms which can be indicative of a failed battery. Some of these symptoms can lead to entire system failure and the requirement for premature (and costly) replacement. One condition in particular can create a dangerous situation for persons servicing the system or bystanders: thermal runaway. Thermal runaway is a critical condition arising during constant voltage charging in which the current and the internal temperature of a battery produce a cumulative mutually reinforcing effect which further increases them and can lead to the destruction of the battery.

There are a number of systems and devices on the market which provide either off-line monitoring or in service test. Depending on the price and complexity level, each of these systems provide a more or less comprehensive evaluation of system performance. However, the present systems represent a relatively complex installation process and do not, according to the Applicant, provide continuous performance monitoring.

As an example of the present systems and the parameters which are monitored, reference may be made to the following U.S. Pat. Nos. 4,707,795; 5,546,003; 4,916,438; 4,217,645; 5,206,578.

These systems generally provide sensing means at each battery, connecting each sensing means to a remote monitor through analog communication means such as a pair of copper wires and sensing a variety of parameters for each battery. The remote monitor or the sensing means directly perform calculations to extract from the sensed parameters values for indicia such as battery voltage, battery temperature, system voltage, ambient temperature, float current, AC component of the battery voltage, AC current component, etc. However, each of these systems describes a complex installation process, and the installation of some of these systems may require taking the battery system off-line during set-up which users do not appreciate.

It is also known in the art to measure a variety of parameters while charging, discharging, loading or using the battery system.

One of the parameters which can be useful to measure is the battery impedance to provide an indication of the condition of the battery. Typically, in order to measure the impedance, a current is imposed on the battery and the resulting voltage measured in order to calculate the impedance since both voltage and current are known. One such system for measuring the impedance of a plurality of batteries (not each individual battery) is described in U.S. Pat. No. 5,281,920. The system of this patent divides each string of batteries into two and applies the current only to one half of the string. The disadvantage with this system is that it is cumbersome to install, and the voltage that is measured is done so for the totality of the half-string, not for each individual battery and so is the resulting value for the impedance.

Accordingly, it is desirable to continuously monitor a battery system to provide adequate information in order to evaluate the performance of the system and to perform preventive maintenance on the system.

SUMMARY OF THE INVENTION

It is an object of the invention to provide an interface device which provides adequate information between at least a portion of a string of batteries serially connected and which can be easily installed with a minimum of manipulation.

In accordance with the invention, this object is achieved with an interface device for interfacing at least a portion of at least one string of batteries with a battery monitoring system. The interface device includes at least one probe means for respectively probing the portion of the at least one string, each of probe means including a controllable sensing means for sensing a plurality of parameters of the corresponding portion, a communication means for communicating data to and from the controllable sensing means, the data including control signals sent from the battery monitoring system to the controllable sensing means, and information signals relating to the parameters of the corresponding portion that are selected by the control signals; and a memory for memorizing an address assigned to the corresponding probe means upon reception of an initialization signal sent by the battery monitoring system via the communication means. The interface device further includes a bus for serially interconnecting the communication means of each of the at least one probe means to the battery monitoring system in a daisy chain manner.

The invention is also concerned with a battery monitoring system comprising a plurality of interface devices and a system server.

It is another object of the invention to provide a battery monitoring system which accurately and easily measures the battery impedance for each battery in a string of batteries. A corollary object of the invention is to provide a method for measuring the battery impedance of a plurality of batteries serially connected to form at least one string of batteries.

In accordance with the invention, this other object is achieved with a plurality of batteries connected in series to form at least one string of batteries; a plurality of probe means for respectively probing at least a portion of the at least one string, each of the probe means including: a controllable sensing means for sensing a plurality of parameters of the corresponding portion; a communication means for communicating data to and from the controllable sensing means, the data including control signals and information signals relating to the parameters of the corresponding portion that are selected by the control signal; a bus for serially interconnecting the communication means of each of said at least one probe means in a daisy chain manner.

The battery monitoring system also includes a current injection means connected to the at least one string for injecting a current in the at least one string upon receipt of a control signal. The system is further provided with a system server connected to the bus and configured to select one of the probe means, to transmit control signals to a selected one of the probe means and to receive information signals relating to the characteristics of the corresponding portion, memory means for storing the information signals, calculating means for calculating a plurality of values relating to the characteristics and alarm means for raising an alarm when one or more of the values is outside a predetermined range. The system server is operatively connected to the current injection means for sending a control signal to the current injection means to inject a current in said at least one string.

The invention further provides for a method for initializing each probe in a battery monitoring system, and a method for measuring the internal impedance of a battery within a string of batteries.

BRIEF DESCRIPTION OF THE DRAWINGS

These and other objects of the present invention and its advantages will be more easily understood after reading the following non-restrictive description of preferred embodiments thereof, made with reference to the following drawings in which:

FIG. 1 is a schematic representation of a battery performance probe according to a preferred embodiment of the invention;

FIG. 2 is a schematic representation of a portion of a current probe according to a preferred embodiment of the invention;

FIG. 3 is a schematic representation of a portion of a rectifier voltage probe according to a preferred embodiment of the invention;

FIG. 4 is a block diagram representation of a system server according to a preferred embodiment of the invention;

FIG. 5 is a flow chart of the method for initializing a probe according to a preferred embodiment of the invention;

FIG. 6 is a flow chart of the method for scanning according to, a preferred embodiment of the invention;

FIG. 7 is a representation of a digital word for use in communicating sensed information in a probe to the system server;

FIG. 8 is a schematic representation of a discharge event definition;

FIG. 9 is a schematic representation of a discharge event and energy count; and

FIG. 10 is a schematic representation of a battery monitoring system according to one configuration of the invention, where only the serial interconnection of the select wire is shown.

DESCRIPTION OF A PREFERRED EMBODIMENT OF THE INVENTION

Traditional back-up battery systems comprise a plurality of batteries 3 connected in series to form a string 1. A back-up system can include more than one string 1 (although only one is shown in FIG. 1), depending on the power requirements of the user. Such an arrangement is well known in the prior art.

A battery monitoring system according to the present invention basically comprises a number of interface devices including probe means 10 and bus means 50 (shown in FIG. 1) and a system server 100. The probe means 10 are individually connected to a corresponding portion of a string 1 of batteries 3, and are serially interconnected to the bus means 50, which in the preferred embodiment of the invention is a daisy chain bus having five wires, two of which are used for power 51, 52, one is a broadcast out 53, one is a broadcast in 54 and one is a select 55. It should be noted that only the select 55 wire performs the serial interconnection (as shown in FIG. 1), and the other four wires 51–54 are a parallel connection.

The daisy chain 50 is connected to the system server 100, which analyses the information assembled by the probe means 10 and is programmed to trigger alarms and log historical data, among other functionalities.

The system according to the invention provides for modularity, in that any number of batteries 3 in any number of strings 1 may be monitored. Furthermore, the final configuration of the batteries 3 to be monitored does not need to be known prior to installation, and the system allows for additional (or less) batteries 3 than the original configuration to be present in the strings 1, without having to spend time and money reconfiguring the system i.e. manually and physically addressing each of the probe means, as will be hereinafter explained. Furthermore, the system should not be interpreted as being limited to the parameters hereinafter detailed, since the system is fully modular and reconfigurable, within the end user's specifications, so that one or a combination of parameters can be monitored.

To that effect, one of the main objects of the invention is to provide for an interface device for interfacing at least one battery 3 with a battery monitoring system, where each of the interface devices is connected to a system server through a daisy chain bus, so that upon reception of an initialize signal, each interface device clears an address present in its memory. The system server then sends a signal to the first interface device to set an address and transmit the address to the system server. Once the address is received, the system server sends a signal to the interface to deactivate or deselect itself and send a signal to the next interface device to be selected, and repeat the addressing process until all interface devices have stored an address.

It should be noted that the select wire 55 is used exclusively during the initalization phase. In broad terms, the battery monitoring system according to the invention operates in two modes: initialization and regular scanning. During the initalization phase, the system server sends out a reset signal via the broadcast out wire. This signal deselects and resets all probe means connected to the daisy chain. Following the reset signal, the first probe means in the chain is selected by the system server through the select channel. The probe (already in the reset stage), receives an address signal from the broadcast out bus and stores it in its memory. Once the address is stored, an acknowledge message is sent to the system server on the broadcast in channel. The probe then de-selects itself and sends a signal of the select channel to activate the next probe in the daisy chain. It should be noted that the next probe is selected by the previous probe, and not by the system server. Using this sequence, the next probe's address will be assigned in numerical order. The system server, in this case, controls only the probe acknowledgement coming via the broadcast in channel. Once the last address in the chain is received, the system server selects the first probe in the next daisy chain, if there is one, and performs the identical steps as above.

Accordingly, the system initialization is easily performed once all of the interface devices have been connected to a respective portion of a string, and interconnected to a bus in a daisy chain manner.

Following the initialization phase, the system server switches to the regular scanning mode. The difference between the initialization mode or phase and the regular scanning mode or phase lies in the fact that while all the probe means are de-selected and in listen mode, the probe means that is being selected by the system server monitors the broadcast in channel to see if it is being addressed. If the probe means recognizes its address, it sends an acknowledgement signal to the system server by repeating its address on the broadcast out channel. Following the address acknowledgement, the probe means then transmits to the system server the data monitored, as will be hereinafter detailed.

The invention also provides for a battery monitoring system so interconnected.

The invention is also concerned with a battery monitoring system for measuring the impedance of a battery, where the system server is operatively connected to current injection means. Each string in the battery system is provided with a corresponding current injection means. Preferably, however, only one current injection means are used for all of the strings present in a battery system. When the system server sends a signal to the current injection means, a current is fed to all of the batteries in the string or strings simultaneously. The resulting voltage appearing at the terminals of each of the batteries is monitored by each interface device, and transmitted to the system server for calculation. The system server can then calculate the impedance of each of the batteries in each of the strings. In a preferred embodiment, the current that is injected in each of the strings is an AC current, and more preferably, an AC current having the shape of a sine wave.

Each of the components of the battery system will be hereinafter detailed separately.

INTERFACE DEVICES

Referring now to FIGS. 1–3, there is shown a schematic representation of an interface device. The interface device basically comprises probe means and a bus. It should be noted that each portion of a string of batteries is provided with its own probe. Each probe has a communication module, a sensing module and an AC module.

As contemplated by the invention, three different types of probe means can be used with a battery system: a battery performance probe, a current probe and a rectifier voltage probe. It should be noted that the communication module is identical for each of the three types of probes. It should be further noted that the battery performance probe and the current probe are further provided with and have identical AC modules. In fact, the difference between the three types of probes lies only in the portion of the sensing module that senses the various characteristics of the portion of the string.

The communications module includes controller means, an analog to digital converter (ADC) and multiplexer (MUX) means. Preferably, the ADC and the MUX are integrated. The MUX has four analog inputs, hereinafter referred to as channels 1, 2, 3 and 4, for receiving information from the sensing module.

The controller means are connected to the daisy chain through optical insulation means.

The sensing module has an analog front end, the analog front end being connected to the corresponding portion of the string and to the multiplexer of the communication means.

Each of the three types of probe means, and more specifically, each of the sensing modules will be detailed hereinafter.

BATTERY PERFORMANCE PROBE

The battery performance probe measures the performance of each individual battery in the battery system, and measures the following parameters: battery DC voltage, temperature of the negative terminal of the battery and AC voltage drop during impedance measurements. Accordingly, the respective portion of the string to which the battery performance probe is connected is the positive (PT) and negative (NT) terminals of the battery to be monitored.

Analog Front end (or Sensing Module)

The analog front end or sensing module of the battery performance probe includes a protection circuit consisting of a fuse F1 and a Zener diode D1. The fuse is connected to the PT of the battery and is preferably a Polly switch with 90 mA hold current. The fuse will be activated in the following cases: when a short circuit increases the probe's input current; when the battery voltage exceeds the Zener voltage of diode D1 (i.e. 16V); or when the PT and NT terminals are reversed.

Such an arrangement exhausts all possible scenarios of probe failure. In all cases, when the F I current increases above the trip level (200 mA), the Polly switch will heat up thereby causing the fuse resistance to increase approximately 5 times its magnitude. Once the failure current returns to normal operating values, the fuse cools down and its resistance is reduced to a very small value. Consequently, any voltage exceeding 16V is clamped to the value of the Zener diode voltage. This is also true for a reversed voltage, but the input voltage is now clamped to the forward voltage value of the Zener diode.

The positive terminal of the battery is further connected to a voltage divider network R1 and R2, which preferably divides the input voltage by 3 in order to adjust the ADC input voltage to match that of the battery. The division by a factor of 3 has been chosen to fit a maximum range of battery voltages (up to 15 V DC) to the maximum input voltage for the MUJX/ADC, i.e. 5 V DC. Preferably, since resistors R1 and R2 create an input path between the negative and positive terminals of the battery, an additional protection is provided by using R1 as a two-part resistance, one created by an overrated (0.5W) power, flame-proof resistor and the other one by a regular SMT resistor.

The voltage divider circuit is followed by a low pass filter to eliminate high frequency components. The cut-off frequency of this filter preferably approximately 5 Hz, which is sufficient for most applications since the 60 Hz component (typical for industrial applications) does not exceed 10% of its original value. The output of the low pass filter is connected to channel 2 of the multiplexer so that this channel monitors the DC voltage of the battery under test.

The negative terminal of the battery is connected to a thermal probe, the circuit of which is illustrated on FIG. 3 (the thermal probe circuit is identical for the rectifier voltage probe and the battery performance probe). The thermal probe includes a thermistor $R_T$ with a 5K resistance at 25° C. is used as a thermal sensor. The resistance value of the sensor drops with increased temperature causing voltage across the positive and negative terminals of the battery to drop accordingly. The combination of the resistor RP, the capacitor C4 and the resistance $R_T$, creates a filter with cut-off frequency at approximately 33 Hz. This threshold eliminates the noise caused by the digital signal processing switching as well as generated to the battery during impedance measurements. The output of the thermal probe is connected to channel 3 of the MUX so that this channel monitors the battery's internal temperature. Since the thermistor is a non-linear device, a lookup table is used to calculate the real temperature. It should be noted that the repeatability of the thermistor characteristic is better than 0.2° C. for the entire range between −10° C. and 75° C.

AC Conditioning Section

In order to provide accurate measurements relating to AC components, the probe means further includes an AC conditioning section (or AC module), to condition the peak voltage used for calculating the internal impedance of the battery. This section consists of an input band-pass filter, followed by a peak detector and a low-pass filter.

The AC input to the filter section is connected via resistor RAC, in order to protect the filter input circuitry in the case of an internal short in the AC section. The resistor preferably has a value of 33.2K and is preferably rated as a flame retardant 300V DC resistor with 500 mW power dissipation. This arrangement provides an additional protection for the input of the AC section which is normally not protected by the fuse F1.

The input band-pass filter consisting of a resistor and capacitor network has a center frequency set at preferably 60 Hz with a resolution of +0.1 Hz. Preferably, the 5% bandwidth is 0.3 Hz thus providing excellent attenuation of $2^{nd}$ and higher harmonics. The filter's frequency stability is achieved by preferably using ultra stable COG-type capacitors. The DC reference for the filter is set by the resistors at approximately 3V. Since the amplifier is powered by the battery voltage of 12V, the filters uses the full swing of ADC input (approximately 2V above reference voltage). At a band-pass filter gain preferably set at 65.65, the input AC voltage is approximately 14 mV peak to peak of RMS value of input AC voltage. The DC reference voltage is connected to channel 4 of the MUX via the low-pass filter with a cut-off frequency of preferably 1.7 Hz. This voltage is used as the DC reference, subtracted from the peak voltage.

The output of the band-pass filter is connected to a peak detector. The diode Dp charges capacitor Cp up to peak value during a positive peak (which is the actual value above DC reference). During a negative peak, the capacitor is discharged via a resistor. Since the product of the resistor and the capacitor is much larger than 17 ms (1/60 Hz), the voltage drop on the capacitor is very small during the time between two subsequent peaks. This voltage is connected to channel 1 of the MUX via a low-pass filter with a cut-off frequency of preferably 1.7 Hz. This low-pass filter eliminates the ripples in the voltage caused by the discharge of the capacitor.

It should be noted that the AC channel accuracy depends on the sensitivity threshold of the entire AC section. Assuming a required accuracy of 1%, at least 100 bits of the channel 1 of the MUX must be generated. At 1.220703 resolution of the ADC converter, the minimum input voltage has to be at least 1.3 mV of RMS value. Practically, due to additional errors of the ADC conversion (due to linearity, thermal drift, etc.) the minimum required input voltage is approximately 3 mV. This number has to be used when calculating the minimum required AC current for selection of the current transmitter.

It is important to note that the analog section of the probe means is powered by the tested battery voltage for 6-cell batteries. A DC/DC up-converter must be used in the case of 1 to 3 cell batteries.

RECTIFIER VOLTAGE PROBE

In order to evaluate total system performance, the battery monitoring system according to the invention can further include a rectifier voltage probe, which is used to monitor the voltage and performance of a single string. Accordingly, the voltage input is considerable (can be up to 600V), and the sensing module thus is different from the sensing module of the battery performance probe, although the function is the same. It should however be noted that the rectifier voltage probe does not monitor the AC components, so that even though the circuitry may be present, it is deactivated.

A system voltage probe, designated as RVP features single channel input with two ranges: 600 V and 150 V. The analog front end of the probe operates identically as with the battery performance probe, but with a slightly different signal conditioning circuitry (shown on FIG. 3). The R1' and R2' resistors divide the input voltage to a level suitable for ADC conversion (max. 5V). The input of the probe is protected by two series, high voltage flame proof resistors (total of approximately 2 Mohms for 600V probe and 1 Mohm for 150 V). The low pass filter has a cut-off frequency of 10 Hz to filter out any AC components in the rectifier voltage output, and the resulting voltage is applied to channel 2 of the MUX.

The resistor R1' provides protection against eventual short circuits inside the probe. The value of this resistor will be dependent on the probe's range. The reliability of the protection of the circuit is ensured by the use of two 0.5W, flame proof resistors which make up resistor R1'. Preferably, the analog circuitry of the probe is powered by the DC/DC converter from the system server (as shown in FIG. 1).

As above, channel 3 of the MUX is used to perform ambient temperature measurements. It should be noted that the thermal probe circuit is identical for that of the battery performance probe, but that the thermal probe is not connected to a negative terminal of a battery, but is located outside, in order to monitor ambient temperature.

CURRENT PROBE

The current probe is connected in series with any one string and is used to measure the charge/discharge current, float current and the AC component of the string current during impedance measurements, The current is measured through a voltage drop across a shunt resistor. Since a standard 100 mV shunt resistor is used, the range of the current node depends on the shunt nominal current. Once the range of the current node is selected, the shunt voltage conversion factor for different shunts is programmed in the server's memory.

The same shunt resistor is used to measure charge/discharge, float and AC current measurements. The circuitry is shown in FIG. 2.

The shunt resistor is placed in series anywhere in the string to be monitored, and the input terminals of the current probe are connected on either side of the shunt resistor (see FIG. 2).

The current analog front end, or sensing module, consists of an instrumentation amplifier for a first stage of the signal conditioning. Resistor Rg sets the amplifier gain at 12.207. Since the ADC resolution is 1.2207 mV per bit and the shunt voltage is 100 mV, the amplifier resolution is thus 0.1 A/bit. The middle point between charge and discharge (zero level) is set by a reference voltage equal to 2.5000V. A charge current will increase this value, while a discharge current will decrease this value, by an amount proportional to the measured current.

The output signal is filtered by a low-pass filter consisting of Rf and Cf components, and having a cut-off frequency of 5 Hz.

The various ranges for the current node have been obtained by calculating in the server the various conversion factors. This type of node is used for currents up to 1500A which is the maximum range for charge/discharge current. An additional stage of shunt voltage is used for the float current measurements, as illustrated in FIG. 2.

The difference lies essentially in instrumentation amplifier gain, voltage reference and additional amplifying stage. Since the float current has only a positive polarity, the reference voltage is set at a lower value in order to compensate for offset voltage, as well as to increase the range available for the relatively small float current. The gain for the float current channel is approximately 1000. Thus, the above mentioned principle is used for a shunt current of up to 500 A, thereby providing a maximum resolution of 2.3 mA/bit. As before, the last stage of the float current channel is a low-pass filter with a cut-off frequency of 5 Hz.

The third channel of the current node measures the AC component of the shunt current, and is used for eventual internal impedance measurements. This channel is illustrated in FIG. 1, since it is equivalent to the AC conditioning section of the battery performance probe. However, since the input signal is taken from the first stage of the instrumentation amplifier, the total gain of the channel is 12.20703 times larger than that of the Battery Performance node. This feature allows for the measurement of relatively small AC components during the impedance measurement routine.

SUPPLY AND REFERENCE SECTION

The supply and reference section, although illustrated only for the battery performance probe, is identical to each of the three types of probes.

In order for the digital components (as well as the analog components) to be properly powered and the reference voltages normalized, the interface device includes a supply and reference section. This section consists of a linear voltage regulator and a shunt diode type reference. The linear voltage regulator uses a standard fix 5V regulator to power the microcontroller and optocouplers. The total output power capability is preferably in the range of 100 mW.

The reference section uses a shunt diode voltage reference. The precise output reference is set by a voltage divider. The +5V reference is set with a resolution of ±1 mV, and is used as the reference and for VCC for the ADC conversion.

Both supply and reference voltages use the battery's output voltage. The minimum voltage required to supply the probe means is 7.5V, but a typical value is 13.5VDC for a fully charged battery in float mode.

ADC CONVERSION SECTION

The ADC section for each of the three types of probes are identical.

Since the various parameters that are measured by each of the three types of probes produce analog values, and in order to permit accurate calculations, the parameters must be converted into digital values. To that effect, the probe means, as mentioned above, include an analog-to-digital converter. The ADC is preferably an LT1594 ADC converter, which is a four channel, 5V micropower, 12 bits sampling converter. However, it should be readily apparent that any other analog-to-digital converter can be used. Since the reference voltage used is 5V, the resolution of the converter is 1.220703 mV at the input of the ADC's multiplexer. The effective resolution of the DC input (channel 2) is 3 times this value, or 3.67 mV. For a typical value of 13.5Vdc battery voltage in float mode, the error is approximately 0.03%. However, due to other factors, such as temperature drift of the voltage divider, inaccuracy of adjustments, etc., the effective error claimed for this measurement is 0.2% for the entire range of battery voltages (from 7.5Vdc to 15Vdc), and 0.15% for the typical range of 12 to 15 Vdc.

It should also be noted that the operation of the ADC is controlled by the microcontroller.

CONTROLLER MEANS

The controller means handle the digital data processing in the communication means, and essentially provides for communication with the system server via the broadcast in and broadcast out channels, controls the MUX and ADC, following the various measurements compiles the digital word to be sent to the system server and performs general housekeeping functions such as checksum generation, LED control, etc.

An important feature of the controller means is that they can listen to the broadcast in bus, and include memory means for storing an address. At all times the controller means listen to the broadcast in bus in order to recognize at least one of two signals: a reset and an address. Following the reset signal, the controller means clears the address within its memory and waits to be selected by the select channel before responding.

Once the system is initialized and in monitoring mode, the controller means listen to the broadcast in channel to see if its address is on the bus.

Thus, when the controller means receive a selection signal from the system server in the form of its address on the broadcast in channel, the controller means generate an acknowledgement signal and generate a MUX address to select an analog signal connected to the input of the multiplexer. The analog signal is converted into digital form by the ADC. The same process can be repeated for each of the MUX channels. Alternatively, the selection signal can include a sub-signal identifying only one channel for which a reply is required by the system server.

The digital signal is then packaged by the controller means into a digital word which consists of 19 hexadecimal characters as illustrated in FIG. 7. The first two digits are the probe address, the next three are the digital data from channel 1 of the MUX, the next three are the digital data from channel 2 of the MUX, the next three are the digital data from channel 3 of the MUX, the next three are the digital data from channel 4 of the MUX, the next two are a checksum generated by the controller means to ensure data integrity and the last digit is representative of the probe status. It should be noted that other formats for the digital word can be used, and are all within the skill of a person expert in this field.

The controller means also include a clock which is generated by an external crystal oscillator with a resonant frequency of preferably 4 MHz. A resistor network provides for pull-up for incoming signals. Additional resistors can be used to provide for current limiting features when the controller means control the optocouplers. Another resistor is used, and its value is dependent on the application of the probe means.

Since the probe means can be connected to different levels of system voltage, there must be insulation means between the processor means and the bus, preferably in the form of dual optocouplers. Preferably, each section of the optocouplers insulates one channel of the bus. The preferred optocouplers have breakdown voltages of 2500V DC applied during a one second period.

Each probe means is also preferably provided with LEDs to inform a user on the actual status of the processor. The configuration that has been chosen is the following: if the LED is off, the probe is not powered or not selected and is in waiting mode. If the LED is flashing at a frequency of approximately 2 HZ, the probe has been resetted and is waiting to be addressed. If the LED is off, the probe has been selected, but a response has not been sent due to faulty conditions. Finally, if the LED is flashing with a periodic on time of 0.5 sec, the probe is selected and operates properly. It should also be recognized that other configurations for visual indication of probe status can be used.

SYSTEM SERVER

As mentioned above, the system server provides the interface between the probe means, system peripherals and the customer interface. The system server collects the data monitored by the probe means, performs digital data processing, including the required calculations, and provides information to a user via communications interfaces.

A block diagram of the system server is shown in FIG. 4. As can be seen, the system server includes a central processing unit (including memory means), communications modules for connecting system connectors such as a local rectifier voltage probe, a local modem or a TCM module, for connecting a bi-directional communication port such as an RS232 port, a modem circuit for connecting an external modem, an equipment watchdog circuit (for indicating equipment failures). The CPU is also provided with an auxiliary input-output driver which drives alarm relays and visual indicators. The bus is directly connected to the CPU. The CPU allows for customer alarm inputs, which are fully configurable. Evidently, the system server also includes power up means and reset means.

The system server can thus communicate with the outside world via the RS232 port. Alternatively, the system server can be accessed via a local computer, such as a laptop, a hand-held PC unit including a keyboard, or a modem.

In a preferred embodiment of the system server, the CPU can be one of two microcontrollers manufactured by Dallas Semiconductor. The DS2252(T) model can be used for the regular version of the system server, consisting of all of the above functions of the system. This microcontroller is an 8051 compatible microcontroller based on nonvolatile RAM technology. This chip has been designed for systems that need to protect memory contents from the disclosure, so that any person attempting to tamper with its contents will trigger the microcontroller to erase the memory contents, or otherwise deny access thereto. Alternatively, the DS5000(T) model can be used in reduced cost versions of the battery monitoring system. This model however does not provide access with a hand-held unit, nor does it support impedance measurement of each batteries in the system. This chip is a 8051 fully compatible 8-bit CMOS microcontroller that offers softness in all aspects of its application. This is accomplished through the comprehensive use of non-volatile technology to preserve its content in the absence of Vcc.

The processor means preferably operate with a 11.0592 MHz clock.

The system server features a standard (or monitoring) mode of operation, and an active mode of operation. In the standard mode, the system server performs only passive monitoring of the system's performance. In the active mode, the server performs monitoring as well as provides feedback to the system rectifier if either different thermal ambient conditions are monitored, or thermal runaway is detected.

The system server's standard mode of operation includes system housekeeping and monitored data processing, such as measurements, calculations, alarms and data storage. Both of these operate simultaneously during the interrupt routine, however each mode will be described separately.

SYSTEM HOUSEKEEPING

The system housekeeping operation includes system configuration, reset function, system initialization, equipment failure detection, auto-call management, time keeping and database management.

The fact that the system according to the invention is modular requires that configuration information be provided in the system server's internal memory. The configuration data includes site identification, number of probes (up to a maximum of 255), number of cells per battery (1 to 6), number of strings (1 to 5), number of current probes (1 to 5—same as the number of strings), number of battery probe means (up to 255), rectifier voltage probe presence, ambient temperature probe presence (YES/NO), customer alarm input activation (ON/OFF for each customer alarm input) and buzzer status (ON/OFF). It should be noted that the above numbers for the various types of probe means are for the preferred embodiment of the invention, but that increased numbers, and thus increased modularity, can easily be integrated by adding memory and software for controlling the various additional components.

The battery monitoring system according to a preferred embodiment of the invention can have a plurality of configurations. In a simple configuration, as that shown in FIG. 10, the back-up battery system comprises only one string of ten batteries. Each of the batteries is provided with a battery performance probe. The string is provided with a shunt resistor in series with the string, to which is connected a current probe. The total string is also provided with a rectifier voltage probe, in order to measure ambient temperature and total string performance. This setup would then have 12 probe means, all serially connected to three daisy chains: battery daisy chain (here 10 probe means); current daisy chain (here 1 probe means, but can be up to 5); and auxiliary daisy chain (here RVP). The split into three daisy chains is preferable in order to reduce the high power requirements to the output driver. For ease of clarity, only the serial interconnection of the select channel have been shown on FIG. 10. It should further be readily apparent that a battery monitoring system according to the present invention could be limited only to battery performance probes (in order to monitor only the DC performance of each of the batteries), or could be further provided with a current probe for each of the strings (thereby permitting the monitoring of the internal impedance of each of the batteries), or could be further or alternatively provided with a rectifier voltage probe for each of the strings, in order to monitor ambient temperature and therefore thermal runaway.

The configuration information can be uploaded to the system server's memory locally via a portable terminal or remotely via a modem and a remote PC.

The reset function, which effectively clears the configuration of the system server's memory, is performed in the following cases: during "Power On" routine, so that each powering up of the system first resets all probes, then re-addresses them and verifies what equipment, if any, is connected to the RS232 port; on request by pressing the RST button provided on the system server; and remotely via a command sent through the RS232 port—this type of reset, usually referred to as a soft reset, resets all probes, but does not verify which equipment is connected to the RS232 port.

Following each reset, the addresses of all of the probes are erased and the system initialization process is performed (see FIG. 5).

The initialization process includes the following steps:

review the actual system configuration stored in the system server's memory;

send a reset request to all probes, after which each probe erases its address and sets itself to listen mode;

verify the number of probes connected to each input of the server, if the verified configuration agrees with the stored configuration, continue with initialization process;

select the first probe by setting a low voltage on the first probe select channel;

by the probe, sending an active state confirmation to the system server via the broadcast in channels;

if the active state confirmation is not received within a specified time frame, of the received data is corrupted, the system server stops the initialization process and sends a "Probe # error–initialization fail";

if the active state confirmation is correct, the system server sends the first address to the first probe;

the probe registers this address in its own memory and sends an acknowledgement to the system server via the broadcast in channels;

if the response is not received within a specified time of the received data is corrupted, the system server stops the initialization process and sends a "Probe # error–initialization fail";

if the response is correct, the system server sends a message to the probe to de-select itself and select the next probe in the daisy chain;

the first probe de-selects itself and selects the next one in the chain by setting a low voltage on the select channel;

repeat the steps for addressing for each subsequent probe in each string;

after the last probe has been addressed, the system server sends a message to the computer "server initialized successfully", and the system server switches to regular scanning mode.

Using the above process ensures that a failed or absent probe will be quickly identified in the chain when the response signal is not received by the system server. In such a case, the system server stops the initialization process and raises an alarm. The initialization process will be halted until the problem is fixed or a new configuration is programmed by the user.

It should be noted that the above process identifies only nodes which communicate with the system server using the controller's protocol. Hardware, which does not perform digital communication, will not be identified during the initialization process. This might result in an erroneous reading, for example a reading of 0° C. if the temperature sensor is not present.

The regular scanning mode is performed during normal monitoring process (if no special routine request is received), and includes the following steps (see FIG. 6):

when the initialization has been successful, all of the probes are de-selected and are in listen mode;

the system server sends an address of a probe to be selected on the broadcast out channels;

the probe that recognizes its own address changes its status to active mode;

the probe sends an acknowledgement signal via the broadcast-in channels to the system server; the confirmation consists of the probe's address;

if a response from the probe is not received within a specified time frame, or the data is corrupted, the system server stops the process and initializes the probe verification subroutine;

once the probe is active, the local parameters are monitored, the information is packaged into a digital word, and the digital word is sent to the system server via the broadcast-in channels;

if the data is not received within a specified time frame, the system server stops the process and initializes the probe verification subroutine;

if the received data is corrupted, the system server ignores the digital word and continues its regular operation; however, the information about the corrupt data is stored In the system server's memory; if the data is corrupt three times in a row, the message "Probe # fail" is recorded and an equipment alarm message is logged into the alarm log;

if the received data is correct, the system server sends a message to the probe to de-select itself and go off-line; at this point, the digital word is processed within the system server's processor;

the next probe's address is selected, and the process repeats itself;

following successful data processing from all of the probes in all of the strings, the cycle is repeated again starting with the first probe, at whatever frequency is specified by the user.

Equipment failure detection permits the system server to detect hardware malfunction and report it to the user via the Equipment Failure Alarm (EFA). Since this type of failure practically eliminates the system from operation, the EFA alarm is classified as Major. The EFA section of the software programmed into the system server performs the following operations:

the system server monitors probe performance via the probe's response on the broadcast in channels; if a response is not received, the software stops addressing the following probes and repeat the request for data three times approximately 1 second apart; lack of a response during subsequent calls generates an error message providing the address of the probe which did not respond;

following verification of a not responding probe, the system server selects the next address in the chain; if the failure of the probe is due to a break in the chain, each subsequent probe will be declared as failed; following verification of the last probe in the chain, the system starts this operation all over again;

if the failure of a probe is due to a probe malfunction causing it to broadcast corrupted data, the following probes will perform correctly; the system server will scan all remaining probes as during normal operation until it reaches a faulty probe again;

during operation when there is a modem connected to the system server, the controller monitors the presence of the modem on the RS232 port; if the modem signal is lost, the system server continues monitoring until the signal is detected again; following signal detection, the system server sends an initialization string to the modem in order to establish proper communication via a telephone line, a wireless link or an optical link.

The system server also includes an auto-call function. It can store up to three different telephone numbers each of up to 10 digits. The auto-call function is initiated by a Major Alarm. Once this priority of the alarm is detected, the system server will initiate the auto-call function by dialing the first telephone number in the hierarchy. If this first number does not respond, the second and then the third number are dialed. The system server will retry each of the telephone numbers in order until successful communication is established and the proper information is sent to the remote monitoring station.

In order to properly organize the data within the database, the system server also includes a time-keeping function, in a proper format.

As mentioned previously, the system server stores various events, parameters, calculations, alarms, etc. in a database. The database record consists of the name of the event, for example system overcharge, the actual value of the parameter over the set point, the time of the event, the alarm priority and the alarm status. In the preferred embodiment of the invention, the system server's database can store up to 1500 events. Once the events are reviewed or rewritten to a central, user database, the database can be cleared.

After having received the digital word from a given probe, the system server performs data processing on the information received in order to perform a number of measurements and calculate a plurality of values.

In broad terms, the system server will measure battery voltage, battery temperature, system voltage, ambient temperature, discharge numbers, float current, AC voltage of the battery and AC current component. It should be understood that not all of these measurements need to be performed, and that additional measurements can be performed if so required, depending of the user's needs, and as long as the proper combination of probe means are present in the final configuration for the battery monitoring system. Each of these measurements will be described separately.

Battery voltage is measured by the Battery Performance Probe. The resolution of the measured voltage is approximately 3.6 mV. However, due to other factors such as temperature drift, component tolerance, etc., the combined error is ±10 mV. Once the battery voltage reading is sent to the system server, the controller compares the value with a pre-set value to determine whether an alarm should be raised if the measured value exceeds a predetermined range. For example, the system will raise an alarm is the battery is overcharged, undercharged or discharged. If an alarm condition is detected, the system sets an alarm priority and the alarm is logged into the system server's database.

Battery temperature is measured by the thermal sensor encapsulated in the negative terminal of the Battery Performance Probe, as mentioned above. The thermal sensor is connected to the negative terminal of the associated battery, so that the temperature inside the battery is transferred to the thermal sensor. The time constant of the sensor is approximately 5 minutes, so 1% is achieved after approximately 25 minutes in transient conditions.

The thermal sensor, as explained previously, uses an NTC thermistor with screened characteristics to achieve the 0.2° C. repeatability over the entire range of −10° C. to +75° C. Since the thermistor has a non-linear thermal curve, the output voltage is compared with a look-up table stored in the system server's database (in the standard system server case), or is calculated from an equation in the PC software case. It should be noted that the combined error of the thermal channel is ±0.5° C.

The internal temperature of the battery can be displayed on a PC screen in the direct mode of operation. Otherwise, in a data processing mode of operation, the internal temperature is compared with the ambient temperature. If the internal temperature exceeds the ambient temperature by a predetermined amount, a thermal runaway is declared, the alarm message is logged into the database and a LED on the front of the faceplate is activated. Since a thermal runaway will usually have assigned a Major alarm, the system server also initiates the auto-call function.

The total system voltage is measured by the Rectifier Voltage Probe. As explained above, there are, for the system of the invention, two types: one to measure system voltages in the range of 20 to 150 Vdc, and another to measure system voltages in the range of 100 to 600 Vdc. As also mentioned above, the input of the Rectifier Voltage Probe is protected by overrated, flame proof, high voltage, 2 Mohm serial resistors. It should be noted that the signal processing of the Rectifier Voltage Probe is identical to that of the Battery Performance Probe, and that the combined error in both cases is better than 0.1% across the entire range of the Probe.

The voltage read by the RVP is compared with a set of pre-programmed set points, such as system overcharge, system undercharge, system discharge. If alarm conditions are detected, an alarm message, along with the associated data, is logged into the system server's database, and a LED corresponding to a pre-set priority is activated.

In order to compare the internal battery temperature with the ambient temperature, two different types of sensors can be used. The first, and most simple, is the thermal sensor connected to the RVP. This sensor will be used when all of the batteries being monitored are located in only one area, such as when all of the batteries are located in a single cabinet, or when an RVP function is installed in the system server's hardware. The second, and more complicated, can measure temperatures in up to four different areas (convenient for submarines or other installations where the batteries are scattered). The second alternative requires that each thermal sensor have batteries associated therewith, so that the proper comparisons can be made.

Since the thermal sensor is identical to that of the Battery Performance Probe, the same signal processing is performed. In addition to thermal runaway detection, ambient temperature is also used to detect abnormal temperatures in the area where the batteries are located, and this can generate an ambient temperature alarm (for example, if the cooling system fails, since battery reliability decreases with increased temperature—in this case, batteries are more susceptible to thermal runaway).

Another parameter which is useful for evaluating a battery is the discharge number count. This function measures the number of discharges which have occurred since the initialization of the system, or since the system has been monitored. A discharge event is measured on the basis of the definition presented on FIG. 8. Accordingly, a discharge event is declared when the current value exceeds a pre-set discharge current level (event #1). As long as the current level remains in the discharge area, no new discharges can be declared. However, once the current crosses the zero level, identified as the discharge cancellation point, and move into the charging zone, the discharge number count is ready to declare the next discharge event which will occur when the current again crosses the discharge current level (event #2).

Preferably, the discharge events are classified into two categories, i.e. short and long duration. The user has of course the option of setting the period of time for the "short discharge duration". If the duration of the discharge is less than a pre-set value, the discharge event is accordingly logged into this category and can be displayed on a screen accordingly. Discharges which are longer than this pre-set value are combined with the short discharge events in order to evaluate overall system discharge. In a preferred embodiment of the invention, the data that is displayed is the total number of discharges and the number of short duration discharges.

The battery monitoring system can also include a current probe. Another parameter that is measured is the float current. Since the float current is measured using the same shunt resistor as that for the charge/discharge current, the resolution is considerably affected by the shunt. In a basic configuration (100 A shunt), the resolution is approximately 2.7 mA/bit. If the shunt range increases, the shunt's resistance decreases and the resolution decreases by a proportional amount. Thus, for a 500 A shunt, the resolution is 5.5 mA/bit, whereas for a 1000 A shunt, the resolution is 10.8 mA/bit. The total range of the float current channel is 2.5 A, so that if the float current exceeds this value, the system server's mode of operation automatically switches into charge mode.

As also mentioned previously, each battery probe means has associated therewith one channel to measure the AC voltage drop across the battery. This channel is used to measure the AC voltage following an AC current injection into the battery system. The range of this channel is 0 to 20 mVpp, and although the measurements of this channel are performed during every cycle of the probe's scan, the system server will use this data only following an impedance measurement request, triggered automatically or manually. Otherwise, this data is ignored.

The AC current is also measured by the current probe. The AC current signal is extracted following the first stage of current amplification and then applied to the AC channel identical to that of the battery probe. Further processing of the AC signal in the current probe is done in the same manner as for the battery performance node. The range of AC current measurements is from 0.4 App to 3.5 App. Although, as above, the measurement is performed during every cycle of the probe's scan, the AC current component is used by the system server only following an impedance measurement request. Otherwise, this data is ignored.

The above parameters are measured by a respective probe associated with a respective portion of a string of batteries and then used to perform various calculations in order to evaluate system performance, such as battery differential temperature (used to trigger a thermal runaway alarm), battery impedance and total energy discharged.

The battery differential temperature is calculated to trigger a thermal runaway condition. The battery temperature, measured by the Battery Performance Probe, is subtracted from the battery ambient temperature. If the difference exceeds a pre-set value, a thermal runaway condition is declared and the appropriate alarm is raised. If the monitoring system monitors more than one ambient temperature, in the case where the batteries are located in more than one area, the battery differential temperature is of course measured with respect to the associated ambient temperature, i.e. the internal temperatures of the batteries located in cabinet 1 are compared against the ambient temperature of cabinet 1 only.

In order to perform battery impedance calculations, the system must be equipped with current injection means, and the system server configured accordingly. The impedance calculations are performed periodically, such as once every 24 hours, or can be calculated on demand following a manual request. Following an impedance request, manual or automatic, the system stops monitoring each probe. The current injection means inject a current, preferably an AC current, simultaneously into each string. After approximately 20 seconds, three subsequent samples of each of the AC components (voltage and current) are taken and the average value is calculated. The average components are then used to calculate the battery impedance following Ohm's law, i.e. $Z_b = V_{bac}/I_{sac}$, where $Z_b$ is the battery impedance, $V_{bac}$ is the battery voltage AC component and $I_{sac}$ is the corresponding string current AC component. Since both AC components are average peak values, the impedance is calculated in Ohms. Each battery impedance can be displayed on a computer screen (in the case of a manual request for measurement) but only the values calculated automatically during regular scanning are stored in the system server's database.

It is important to note that the impedance measurements of each of the batteries is performed only in float conditions, so that this section of the software is disabled when the lost current is outside the zone defined by the discharge level and the pre-set float current level. It should also be recognized that the impedance values can be manipulated for graphical representation of the battery impedance trend.

The total energy discharged is calculated when the discharge current exceeds a pre-set discharge level, as shown in FIG. 10. Following detection of a discharge, the energy is calculated using the following formula:

$$P(kWh) = (V_s \times I_s \times T)/3600$$

where: P is the discharged energy in kWh with 0.1 kWh resolution;

$V_s$ is the system voltage in Volts;

$I_s$ is the system current in Amps; and

T is the time interval between subsequent samples, in seconds.

The discharge condition is detected by the polarity and level of current. Once a discharge condition is detected, the system server performs the following steps. A discharge condition is declared following the last probe reading. At this time, the system server terminates all other routines expect those required to perform energy calculations. The serial port is cut off and therefore no communication can be established. The system server terminates the present cycle as soon as the data from the last probe is read. During the customer programmable Short Discharge Duration interval, the system server will scan only the system voltage and current probes. Once the samples are taken, the energy discharge is calculated with a sample rate approximately equal to 1/(t×(1+string number))/per second where t is approximately 0.2 s.

In each subsequent category, the sampling interval will equal the time of a single scan of the entire system (which is approximately the total number of probes multiplied by 0.2 s).

Following the termination of discharge status, the calculated discharge energy is added to the record of the corresponding discharge category (short or long) and the discharge count is increased by one. The number of discharges with a duration shorter than the pre-set time interval are kept in a separate log.

The discharge energy is calculated until the discharge current crosses the zero level and move into the charging zone. The energy discharged during each discharge event is added to the previous one to create a cumulative energy discharge value for the life of the system being monitored.

Once the measurements and calculations are performed, the system server manages the alarms associated therewith and manages the data so accumulated.

The following alarms will be triggered when the appropriate conditions are met.

Cell overcharge alarm will be generated when the battery voltage exceeds a pre-set overcharge limit multiplied by the number of cells per battery;

Cell undercharge alarm will be triggered when the battery voltage drops below a pre-set cell undercharge limit multiplied by the number of cells per battery;

Cell discharge alarm will be triggered when the battery voltage drops below a pre-set cell discharge limit multiplied by the number of cells per battery;

System overcharge alarm will be triggered when the system voltage exceeds a pre-set value of the system overcharge limit;

System undercharge alarm will be triggered when the system voltage exceeds a pre-set value of the system undercharge limit;

Ambient temperature alarm will be triggered when the measured ambient temperature exceeds a pre-set limit;

Thermal runaway alarm will be triggered when the difference between the internal temperature of the battery and the corresponding ambient temperature exceeds a pre-determined limit;

Float current alarm will be triggered when a long term increased float current exceeds a pre-set limit;

Impedance alarm will be triggered when the impedance of a battery increases above a pre-set threshold value;

Configurable customer alarms will be triggered when selected values other than those previously mentioned exceed pre-determined values;

Equipment failure alarm will be triggered when the system server's processor fails, or any of the probes fail.

These alarms are used to inform a user about the actual status of the battery system. In order to simplify the information provided to the user, the preferred embodiment of the invention classifies alarms into two categories: major and minor. The alarms can be assigned a category by the user depending on the user's needs.

All alarms are logged into a history log in the system server. When the history log has been reviewed or downloaded to a remote location, the log can be cleared.

Major and Minor alarms activate respective LEDs, or other visual or audible signals, on the face of the system server. Alternatively, Major alarms only can activate a visual and an audible indicator. It is also preferable if the system server is equipped with a modem that a Major alarm initiates the auto-call function to report the alarm.

It should be noted that the thermal runaway alarm can be classified as a major or a minor alarm. However, in any event, the thermal runaway will activate a LED on the system server.

The equipment alarm is preferably assigned a major alarm priority, since equipment failure practically eliminates any monitoring by the system server. Again, if the system is provided with a modem, the equipment alarm will initiate the auto-call function.

Preferably, all the events which are defined as system alarms are recorded in the history log using the following format: alarm name, status (ON/OFF), location (i.e. probe number), time of alarm and date. Preferably, the history log is organized in a first-in first-out configuration, so that if the history log overflows, the first alarm is removed once the new message causing the overflow is recorded.

Thus, it can be seen that the invention lies in an interface device for interfacing at least one battery with a battery system monitor and to a battery system monitor incorporating the same. One of the aspects of the invention lies in the fact that the probes are "self-addressable", so that each time a reset of the system occurs, the probes can be automatically re-addressed. Furthermore, another aspect of the invention lies in the possibility to calculate the impedance of each battery by injecting an AC current into a whole string, and measuring the corresponding AC voltage and current components at each battery terminals. Furthermore, the invention also provides for methods for initializing a plurality of probes, and for monitoring a plurality of probes in a battery monitoring system.

It should be equally clear from the above description that not all of the abovementioned parameters, calculations and various other features need to be present in each battery monitoring system, or in each interface device. Furthermore, persons skilled in this field will readily recognize that a number of peripherals may be connected to the battery monitoring system, such as a portable access/display unit, a local LED display, a personal computer, a laptop computer or any kind of modem, or other communications, means.

Although the present invention has been explained hereinabove by way of a preferred embodiment thereof, it should be pointed out that any modifications to this preferred embodiment within the scope of the appended claims is not deemed to alter or change the nature and scope of the present invention.

What is claimed is:

1. An interface device for interfacing at least one portion of at least one string of batteries with a battery monitoring system, comprising:

a) at least one probe for respectively probing said at least one portion of said at least one string, each of said at least one probe including:

i) a controllable sensing means for sensing a plurality of parameters of said at least one portion;

ii) a communication means for communicating data to and from the controllable sensing means, the data including control signals sent from the battery monitoring system to the controllable sensing means, and information signals relating to the plurality of parameters of the at least one portion; and iii) a memory for memorizing an address assigned to each of said at least one probe upon reception of an initialization signal sent by the battery monitoring system via the communication means; and b) a bus for serially interconnecting the communication means of each of said at least one probe to the battery monitoring system in a daisy chain manner wherein said bus is a five wire bus, where a first wire is used exclusively for addressing purposes, a second wire is used as a broadcast in channel, a third wire is used as a broadcast out channel, and a fourth and fifth wires are used for supplying voltage.

2. An interface device according to claim 1, wherein:

said communication means includes a multiplexer, an analog to digital converter, controller means for controlling the operation of each of said at least one probe and optical insulation means for insulating said communication means from said bus.

3. An interface device according to claim 2, wherein:

said controllable sensing means of each of said at least one probe includes an alternating current (AC) conditioning section and an analog front end, said analog front end being connected to said at least one portion of said at least one string and to said multiplexer of said communication means.

4. An interface device according to claim 1, wherein at least one of said at least one probe is a battery performance probe, and said at least one portion of said at least one string includes a positive and negative terminal of a battery, said at least one probe being connected to said positive and negative terminals of said battery.

5. An interface device according to claim 1, wherein at least one of said at least one probe is a current probe, and said at least one portion of said at least one string includes a shunt resistor, said at least one probe being connected to said shunt resistor.

6. An interface device according to claim 1, wherein at least one said at least one probe is a rectifier voltage probe, and said at least one portion of said at least one string is said at least one string as a whole having a positive and negative terminal, said at least one probe being connected to said positive and negative terminals of said at least one string.

7. A battery monitoring system comprising:
 a) a plurality of batteries connected in series to form at least one string of batteries;
 b) a plurality of probes for respectively probing a portion of said at least one string, each probe of the plurality of probes include:
  i) a controllable sensing means for sensing a plurality of parameters of the portion of said at least one string;
  ii) a communication means for communicating data to and from the controllable sensing means, the data including control signals and information signals relating to the plurality of parameters of the portion of said at least one string;
  iii) a memory for memorizing an address assigned to said probe of the plurality of probes upon reception of an initialization signal;
  iv) a bus for serially interconnecting the communication means of each of said plurality of probes in a daisy chain manner wherein said bus is a five wire bus, where a first wire is used exclusively for addressing purposes, a second wire is used as a broadcast in channel, a third wire is used a broadcast out channel, and a fourth and fifth wires are used for supplying voltage; and
 c) a system server connected to said bus and configured to transmit said initialization signal, to receive respective addresses from each of said plurality of probes, to select one of said plurality of probes, to transmit control signals to a selected one of said plurality of probes and to receive information signals relating to the characteristics of the portion of said at least one string, memory means for storing said information signals, calculating means for calculating a plurality of values relating to said characteristics and alarm means for raising an alarm when one or more of said plurality of values are outside a predetermined range.

8. A battery monitoring system according to claim 7, wherein: said communication means includes a multiplexer, an analog to digital converter, microprocessor means for controlling the operation of said plurality of probes and optical insulation means for insulating said communication means from said bus.

9. A battery monitoring system according to claim 8, wherein: said controllable sensing means of each of said plurality of probes includes an alternating current (AC) conditioning section and an analog front end, said analog front end being connected to said portion of said at least one string and to said multiplexer of said communication means.

10. A battery monitoring system according to claim 7, wherein said plurality of probes includes at least one battery performance probe.

11. A battery monitoring system according to claim 10, wherein said plurality of probes further includes at least one current probe.

12. A battery monitoring system according to claim 10, wherein said plurality of probes further includes at least one rectifier voltage probe.

13. A battery monitoring system comprising:
 a) a plurality of batteries connected in series to form at least one string of batteries;
 b) a plurality of probes each of said plurality of probes for probing a corresponding portion of said at least one string, each of said plurality of probes including:
  i) a controllable sensing means for sensing a plurality of parameters of the corresponding portion of said at least one string;
  ii) a communication means for communicating data to and from the controllable sensing means, the data including control signals and information signals relating to the plurality of parameters of the corresponding portion that are selected by the control signals;
 c) a bus for serially interconnecting the communication means of each one of said plurality of probes in a daisy chain manner;
 d) at least one current injection means connected to said at least one string for injecting a current in said at least one string upon receipt of a control signal; and
 e) a system server connected to said bus and configured to select one of said plurality of probes, to transmit control signals to said one of the plurality of probes and to receive information signals relating to the characteristics of the corresponding portion, said system server comprising memory means for storing said information signals, calculating means for calculating a plurality of values relating to said characteristics and alarm means for raising an alarm when one or more of said plurality of values is outside a predetermined range, said system server being operatively connected to said at least one current injection means for sending a control signal to said at least one current injection means to inject a current in said at least one string.

14. A battery monitoring system according to claim 13, wherein said current that is injected by said at least one current injection means is an alternating current.

15. A battery monitoring system according to claim 13, wherein said plurality of probes includes at least one battery performance probe.

16. A battery monitoring system according to claim 15, further comprising a current probe for each of said at least one string.

17. A battery monitoring system according to claim 16, further comprising a rectifier voltage probe for each of said at least one string.

* * * * *